(12) United States Patent
Stegmeier et al.

(10) Patent No.: US 9,364,863 B2
(45) Date of Patent: Jun. 14, 2016

(54) METHOD FOR FORMING AN ULTRASOUND TRANSDUCER ARRAY

(71) Applicants: Stefan Stegmeier, Munich (DE); Jorg Zapf, Munich (DE); Xuanming Lu, Issaquah, WA (US)

(72) Inventors: Stefan Stegmeier, Munich (DE); Jorg Zapf, Munich (DE); Xuanming Lu, Issaquah, WA (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 379 days.

(21) Appl. No.: 13/748,415

(22) Filed: Jan. 23, 2013

(65) Prior Publication Data

US 2014/0203687 A1 Jul. 24, 2014

(51) Int. Cl.

| H04R 31/00 | (2006.01) |
| B06B 1/06 | (2006.01) |
| H01L 27/20 | (2006.01) |
| H01L 41/33 | (2013.01) |
| H01L 41/338 | (2013.01) |

(52) U.S. Cl.
CPC .............. *B06B 1/0629* (2013.01); *H01L 27/20* (2013.01); *H01L 41/33* (2013.01); *H01L 41/338* (2013.01)

(58) Field of Classification Search
CPC ........ B06B 1/0644; B06B 3/00; H01L 27/20; H01L 41/08; H01L 41/338; H01L 41/35; H01L 41/47; H01R 17/00; H01R 31/00; Y10T 29/42; Y10T 29/49002; Y10T 29/49005; Y10T 29/4908; Y10T 29/49789; Y10T 29/49798
USPC .......... 29/417, 25.35, 592.1, 594, 602.1, 609, 29/609.1; 310/333–337, 357, 367
See application file for complete search history.

(56) References Cited

U.S. PATENT DOCUMENTS

| 4,869,768 | A | * | 9/1989 | Zola ............................... 156/245 |
| 5,423,220 | A | * | 6/1995 | Finsterwald et al. ........... 73/642 |
| 5,792,058 | A | * | 8/1998 | Lee et al. ...................... 600/459 |
| 8,008,842 | B2 | | 8/2011 | Jiang et al. |
| 2005/0046030 | A1 | * | 3/2005 | Nakamura ..................... 257/758 |
| 2011/0136322 | A1 | | 6/2011 | Sato et al. |
| 2011/0215677 | A1 | | 9/2011 | Jiang et al. |

OTHER PUBLICATIONS

M. Kumagai, et al., *Laser processing of doped silicon wafer by the Stealth Dicing*, IEEE, pp. 1-4, 2007.
X. Jiang, et al., *Microfabrication of Piezoelectric Composite Ultrasound Transducers (PC-MUT)*, IEEE Ultrasonics Symposium, pp. 918-921, 2006.

* cited by examiner

*Primary Examiner* — Paul D Kim

(57) ABSTRACT

An ultrasound transducer array is formed with stealth dicing. A laser is used to form defects within the piezoelectric substrate and along the desired kerf locations. The substrate is fractured along the defects. A controlled expansion, such as using thermal expansion, may be used to establish the desired kerf width. Spacers may be used to maintain the desired kerf width. The kerfs are filled to create the ultrasound transducer array.

15 Claims, 3 Drawing Sheets

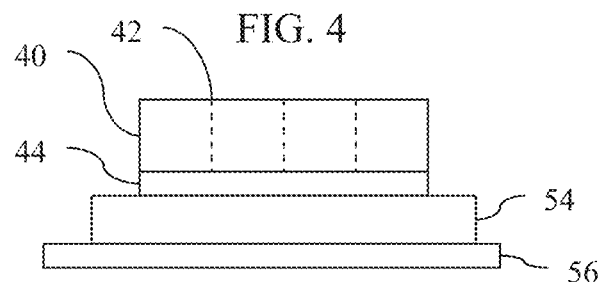
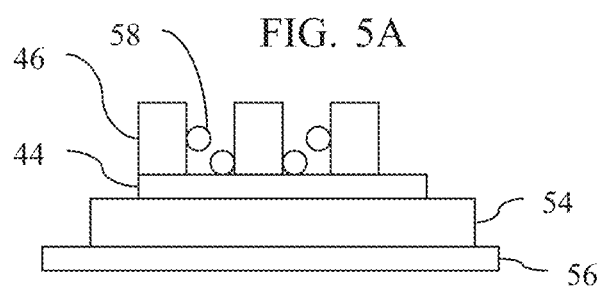
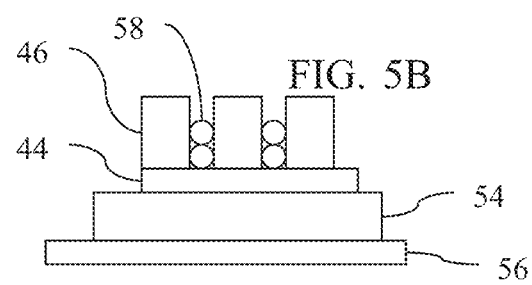

METHOD FOR FORMING AN ULTRASOUND TRANSDUCER ARRAY

BACKGROUND

The present embodiments relates to transducer arrays. In particular, the elements of an ultrasound transducer are formed from a substrate.

The substrate is a piezoelectric ceramic. The substrate is diced into multiple elements. The gaps or kerfs between separated elements are filled to form a composite, such as a 1-3 composite.

One example dicing technique is a dicing saw. A blade cuts the substrate. However, the blade dicing may be slow and result in elements with large kerfs and chipping at the dicing edges. The minimum kerf width is about 15 micrometers. Large kerfs reduce the active area for transduction, which reduces sensitivity.

Another example dicing technique is deep reactive ion etching (DRIE). In DRIE, coating with a seed layer, coating with a photo resist, patterning, electroplating to form an etching mask, and deep reactive ion etching are performed. However, DRIE is process intensive and expensive. The thickness of the substrate may be limited due to the etching angle.

BRIEF SUMMARY

By way of introduction, the preferred embodiments described below include systems, arrays and methods of forming an ultrasound transducer array. A laser is used to form defects within the substrate and along the desired kerf locations. The substrate is fractured along the defects. A controlled expansion, such as using thermal expansion, may be used to establish the desired kerf width. Spacers may be used to maintain the desired kerf width. The kerfs are filled to create the ultrasound transducer array.

In a first aspect, a method is provided for forming an ultrasound transducer array. A laser forms defects along lines within a ceramic transducer substrate. The ceramic transducer substrate is fractured at the lines into elements of the ultrasound transducer array. Gaps between the elements are thermally expanded. Spacers are inserted into the gaps between the elements while expanded. The gaps are thermally reduced with the spacers in the gaps. The gaps are filled with kerf filler after the reducing.

In a second aspect, a method is provided for forming an ultrasound transducer array. Defects are generated in a pattern within an interior of a substrate of lead magnesium niobate-lead titanate crystal. The substrate is broken along the pattern into elements of the ultrasound transducer array. Polymer is cured in gaps between the elements where the gaps are less than 15 microns in width.

In a third aspect, an ultrasound transducer array is provided. A plurality of elements is spaced apart by less than fifteen microns. Composite filler material is positioned between the elements. The elements are monocrystalline transducer material with at least one edge having polycrystalline material from defects formed to separate the elements from a substrate.

The present invention is defined by the following claims, and nothing in this section should be taken as a limitation on those claims. Further aspects and advantages of the invention are discussed below in conjunction with the preferred embodiments.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

FIG. 4 shows one embodiment of a substrate with defects on a carrier; and

FIGS. 5A and 5B illustrate the use of spacers in forming the ultrasound transducer according to one embodiment.

DETAILED DESCRIPTION OF THE DRAWINGS AND PRESENTLY PREFERRED EMBODIMENTS

Piezoelectric single crystal composite is formed as an ultrasound transducer. A kerf spacing less than 15 microns is provided between elements or pieces of the crystal, enabling greater sensitivity and bandwidth than with larger kerf spacing. A high frequency single crystal transducer may be provided.

To minimize the spacing between crystals and the width of the kerf filler material, stealth dicing is used for crystal separation. Defects are formed inside the crystal, such as altering crystal structure using a laser. By expansion or other pressure, fractures are made along the defects. In one approach, the carrier material is expanded by temperature. The temperature may be used to control the spacing. In another approach, a spacer filler with a defined diameter (e.g., about 10 microns) is positioned between the separated crystals to establish the spacing.

Stealth dicing, expansion, and subsequent epoxy fill for single crystal composite are combined to form the ultrasound transducer. The expansion, such as thermal expansion, may be used to separate the crystal into elements. A minimum kerf (e.g., 1~5 um) is achievable to improve performance of the single crystal and composite. The space (kerf) of the stealth dicing may be controlled by controlling the expansion and/or by a spacer.

Figure 1:
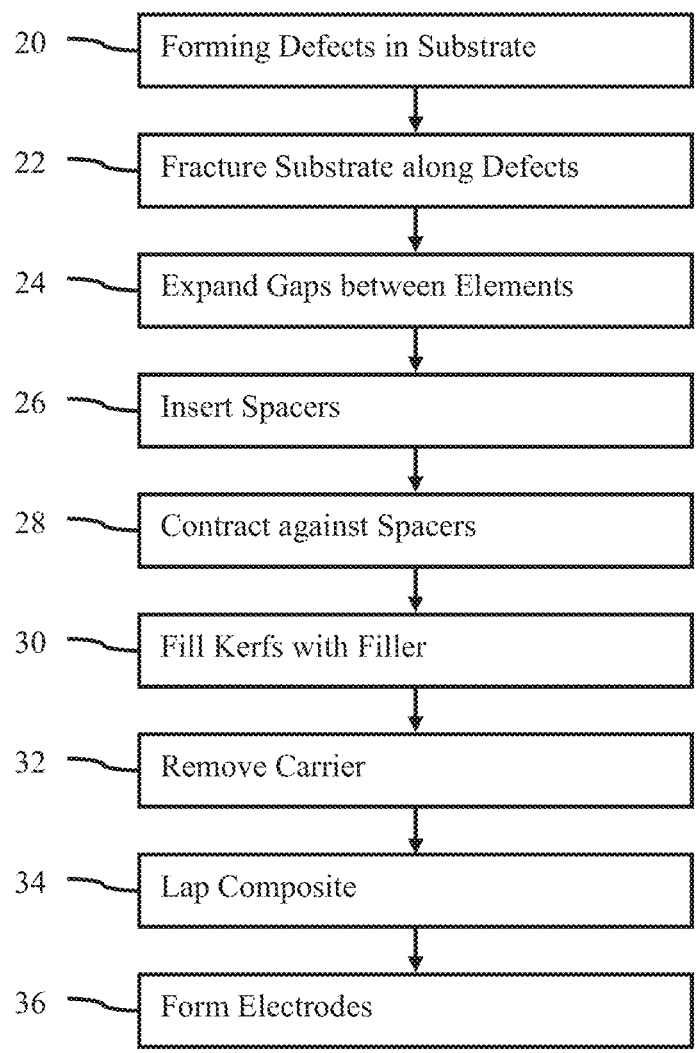
FIG. 1 is a flow chart diagram of one embodiment of a method for forming an ultrasound transducer array.

FIG. 1 shows a flowchart of one embodiment of a method of forming an ultrasound transducer array. FIGS. 2A-F show different stages of manufacturing the transducer array according to the method of FIG. 1 or another method. The ultrasound transducer array is a composite of a plurality of elements connected together or separated by a filler material. This array may be used for further assembly, such as by depositing electrodes, adding one or more matching layers, and stacking with a backing. Even further assembly includes housing the transducer array stack in a probe.

Additional, different, or fewer acts than shown in FIG. 1 may be used. For example, acts 32, 34 and/or 36 are not performed, and the transducer array results from having diced and filled. In another example, acts 26 and 28 are not performed.

The acts are performed in the order shown or a different order. For example, act 24 is performed to cause act 22. As another example, the electrodes may be formed in act 36 prior to any of the other acts.

Figure 2A:
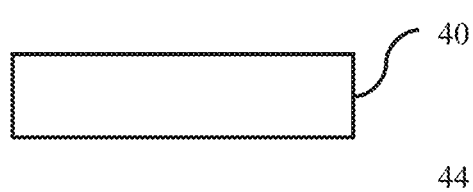
FIGS. 2A-F show example stages of forming an ultrasound transducer array.

To form an ultrasound transducer array, a slab, plate, die, block, wafer, or other structure of transducer material is used. FIG. 2A shows an example cross-section of a substrate 40 of transducer material. The transducer material is a ceramic, such as a monocrystalline or single crystal material. Single crystal or monocrystalline is used generally to describe the majority (e.g., 51%) or greater (e.g., 60% 75%, 80%, 90%, 95% or 99%) purity level of the substrate. In one embodiment, the transducer material is a piezoelectric ("PZT"), such as lead magnesium niobate-lead titanate crystal (PMN-PT). Other PZT ceramics or materials for converting between electrical and acoustic energies may be used.

The substrate 40 has any dimensions. For example, the substrate 40 is a slab for dicing into a one, 1.5D, 1.75D, or 2D array of elements. The substrate 40 has a length based on the number of elements in azimuth and a width based on the number of elements in elevation. The thickness (i.e., depth) of the substrate 40 is based on the frequency, wavelength, or desired transduction characteristics. In one embodiment, the ceramic transducer substrate 40 is 100-500 micrometers thick, such as about 300 micrometers. "About" accounts for manufacturing tolerances.

Figure 2B:
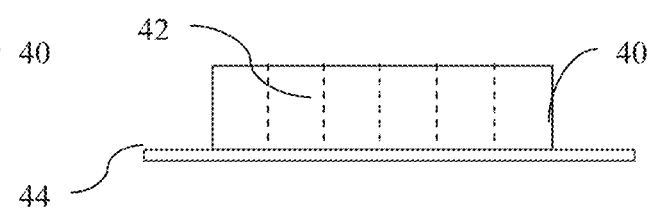

For forming the elements, the substrate 40 is mounted to a tape or carrier. FIG. 2B shows the substrate 40 on a tape 44. FIG. 4 shows the substrate 40 on a carrier 54. Intervening layers may be provided, such as the tape 44 between the substrate 40 and the carrier 54. Multiple tape and/or carrier layers may be provided, such as the carrier 56 supporting the carrier 54 in FIG. 4. Any mounting may be used, such as an adhesive, suction, and/or mechanically connecting (e.g., bolting or latching). In one embodiment, the tape 44 and/or carrier 54 is PVC or PO. Other materials may be used.

Referring to FIGS. 1 and 2B, defects 42 are formed in the ceramic transducer substrate in act 20. The defects 42 are formed with a laser. Stealth dicing is performed. In stealth dicing, the laser is applied to semiconductor substrate such as silicon. For forming a transducer array, the stealth dicing is performed on the transducer material substrate 40. The laser forms defects 42 in the single crystal or other transducer material. The defects 42 act as breaking points for separation in act 22.

Figure 3:
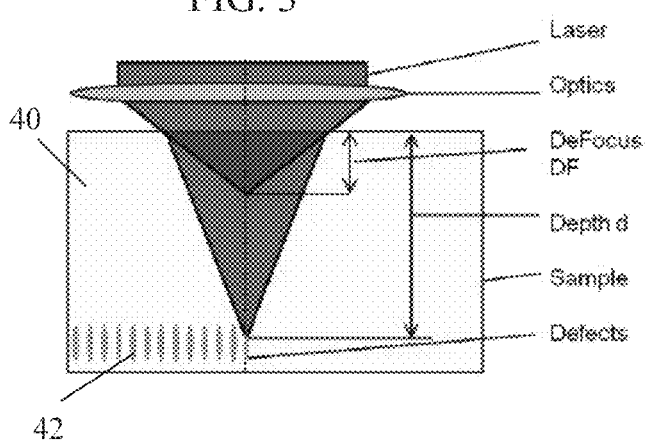
FIG. 3 illustrates an example of stealth dicing.

To form the defects 42, the laser is focused at an interior of the substrate 40. FIG. 3 shows an example. The laser passes through optics, such as a lens, to focus within the substrate 40. The substrate 40 is sufficiently transparent or transmissive to allow the laser to pass through all or some of the substrate 40. By focusing the laser at an interior of the substrate 40, the defects 42 are formed inside of the substrate 40.

The defects 42 form, for example, by converting monocrystalline structure to polycrystalline structure. The focused energy causes localized heat. The heat forms the defect 42. Due to the temperature dependence of the adsorption coefficient, the substrate material becomes adsorbing for the laser light when the temperature rises in the focus point. The defect 42 is formed at the focal point and in a region around the focal point depending on the amount of energy, duration of application, substrate material, thermal diffusion, and degree of focus. Other mechanisms may cause the defects 42. Other transitions may occur or be used to form the defect, such as creating a defect 42 in a polycrystalline material.

One or more of various types of defects 42 may be formed. The change in crystal structure is one. The crystal structure is changed by the laser or heat from the laser. Another type of defect 42 is microcracks. The mechanical stress caused by the heat from the laser creates internal microcracks. The microcracks most likely extend along the laser beam direction due to the heat along the beam. The microcracks extend towards the top, bottom, or both top and bottom of the substrate 40. The microcracks are entirely within the substrate 40 or may extend to the surface. Other types of defects 42 may be formed.

Any type of laser may be used. In one embodiment, the laser is a focused laser with a wavelength of 300-2000 nanometers, such as about 532 or 1064 nanometers. Any energy level may be used, such as 5 micro Jules.

Any laser application process may be used. Any duration or repetition may be used. The substrate 40 may be at any temperature for application. In one embodiment, the laser dicing is a dry process. Rather the using washes or fluid to clean the substrate 40 during formation of the defects 42, no fluid is applied during application of the laser. Debris is not created by the stealth dicing. This may avoid rinsing debris to undesired locations or otherwise fouling the substrate 40.

The substrate 40 is or is not treated for application of the laser. A dicing street may be formed on the top, bottom, or top and bottom surfaces of the substrate 40. The dicing street is a zone clear of other components, such as being clear of reflective surface materials (e.g., no electrode material). The dicing street has a width proportional to the thickness of the substrate 40, such as the width, W, being >0.4*T where T is the thickness sample. The width of the dicing street is provided for focusing through the thickness of the substrate 40. In other embodiments, the entire substrate 40 is clear.

Figure 2C:
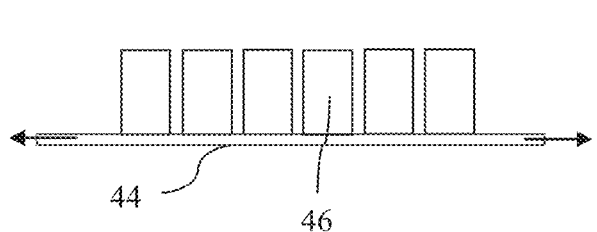
Figure 2D:
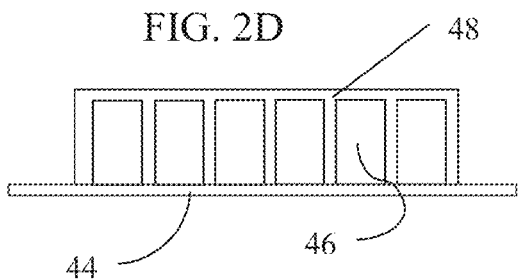
Figure 2E:
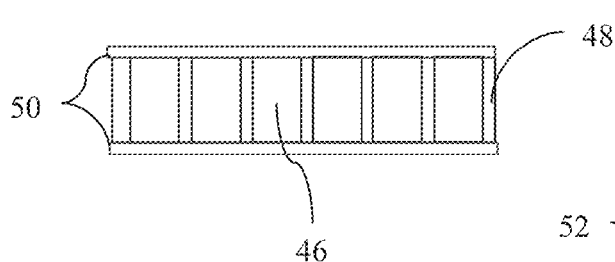
Figure 2F:
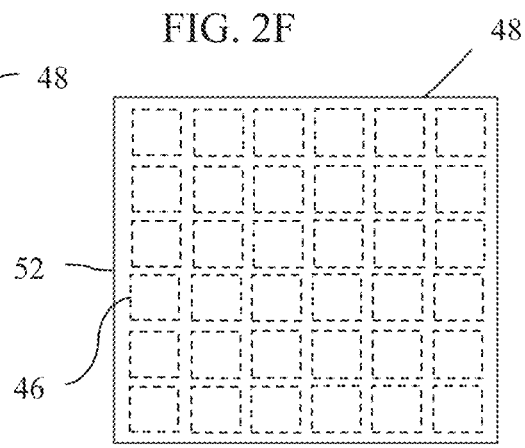

The substrate 40 is to be separated in a pattern. For a one-dimensional array, the pattern is a repeating series of equal distance, parallel lines. For a two-dimensional array, the pattern may be a rectangular or square grid, such as shown in FIG. 2F. Any pattern may be used, such as triangular, circular, octagonal, or irregular layouts of elements 46. The pattern corresponds to or is the desired arrangements of the elements 46 of the transducer array.

The pattern is made up of straight and/or curved lines. To form the pattern, the defects 42 are generated along the lines. The laser is scanned to form continuous, periodic, or spaced apart defects 42 along the line. In the example of FIG. 2B, defects 42 are created along five lines extending into and out of the plane of the figure. In the example of FIG. 2F, the lines are along the horizontal and vertical directions.

The defects 42 are created along the lines at one general depth within the substrate 40. The defects 42 may extend or not to the top or bottom surface. In other embodiments, the defects 42 are formed on the surfaces as well as within the substrate 40 (e.g., focusing the laser sufficiently close to the surface that the defect also occurs at the surface).

For sufficiently thick substrate 40, such as 200 or more micrometers, the defects 42 may be created in a layered pattern. Along each line, the laser is focused to different depths to form defects 42 layered in the depth or thickness dimension. Any order of formation of defects 42 may be used. In one embodiment, the lines are scanned for one layer, and then the scan is repeated for another layer along the lines. In another embodiment, the focus is changed for each position so that defects 42 are formed for multiple layers before scanning to another location along the line. The deepest layer of defects 42 is formed first, where deep is relative to the laser. In alternative embodiments, the deepest layer of defects 42 is formed last or at an intermediary time.

Using stealth dicing to form defects 42 may have various advantages over using a dicing saw. For example, stealth dicing with a laser may be faster (e.g., two hundred times faster). The laser scanning may be performed at about 300 mm/s for thin substrates. Less mechanical stress is applied to the component since the laser scanning is a non-contact process. The dicing lines may be clean with less chipping. Debris is not generated, so less contamination results, and protective films may not be needed. Due to the focus of the laser, less thermal induced structural transformation may occur as compared to the heat generated by a dicing saw. The laser scanning also allows for irregular element shapes and distributions as compared to the saw making straight line cuts over the length of the substrate.

In act 22, the defects 42 are used to fracture the substrate 40 into elements 46 of the transducer array. FIG. 2C shows an example of the substrate 40 fractured along the lines of defects 42 into separate elements 46. The substrate 40 is broken. Due to the defects 42, the breaks occur in or along the pattern. The fractures are through the entire thickness and extend along the width and/or length of the substrate 40. Some deviation may occur due to the structure of the substrate 40.

Force fractures the substrate 40. Applying force to the substrate 40 with the defects 42 causes the fracturing. Any type and/or direction of force may be used. The force is applied against or away from the substrate 40 along the thickness dimension, width dimension, the length dimension, or at other angles. The breaking force may be different than any force used to expand in act 24. For example, thermal expansion is used after mechanical breaking. Alternatively, the force used to expand in act 24 also acts to fracture in act 22. For example, thermal expansion causes the substrate 40 to fracture and moves the resulting elements 46 apart.

The force is applied to break each line separately. The lines are broken or elements 46 are formed sequentially. In alternative embodiments, the entire substrate 40 or portions including multiple lines are broken at once or due to application of the same force.

In one embodiment, the force is applied by a tap expander. For example, a tape expansion machine applies force to the substrate 40. A plate or other structure may be positioned against the tape 44 and press towards the substrate 40 while holding the ends or edges of the tape 44. This causes pressure to fracture the substrate 40. As another example represented in FIG. 2C, the tape 44 is stretched or expanded. The expansion applies stress to the substrate 40, fracturing the substrate 40.

In another embodiment, a breaking bar is used. A bar with a curved or irregular (non-flat) surface is positioned against the tape 44 and/or substrate 40. By sandwiching with another bar, the substrate may be fractured. Alternatively, suction is used to draw the tape 44 and substrate 40 to conform to the irregular surface, breaking the substrate 40.

In yet another embodiment, a three-point bending process is used. Supports are positioned in a spaced apart manner on one side of the substrate. Another support is positioned on an opposite side, but laterally between the spaced apart other supports. By applying force, the substrate 40 is fractured.

Manual breaking may be used. The user positions their finger, their hand, a needle, a support, or other structure against an edge or surface of the substrate 40. By applying force against the substrate 40, fractures are created.

Vacuum expansion may be used. Foam is connected with the substrate 40, such as using the foam as a carrier 54. When a chamber is evacuated, the foam expands. The expansion breaks the substrate 40.

Ultrasonic or other vibration may be used. The substrate 40 is vibrated with sufficient force to break.

Directed heat may be used. Using ultrasound, radio frequency, laser, or other application, heat may be generated along the defects 42 within the substrate 40. The amount, duration, sequence, or rate may be different for fracturing than for forming the defects 42. The heat causes expansion at the defects 42, breaking the substrate 40.

In another embodiment, indirect heat is used. The substrate 40 is positioned on or connected with a carrier 54. The carrier 54 may be the tape 44 (e.g., thermal expansion tape) or separate from the tape 44 as represented in FIG. 4. The carrier 54 may be supported by another carrier 56, such as a tape material. The material of the carrier 54 is selected to expand with increasing temperature at a greater amount than the substrate 40. The coefficient of thermal expansion is selected to be greater than for the substrate 40. This expansion of the carrier 54 causes the substrate 40 to fracture. As the temperature increases, the substrate 40 is broken into elements 46. Any temperature increase rate, process, profile (e.g., linear or non-linear stepped increases), maximum temperature, and/or starting temperature may be used. In one embodiment, the substrate 40 with the carrier 54 is heated to about 150-200 degrees Celsius.

When the substrate 40 is fractured, the elements 46 are separated by gaps. The gaps are a few microns or less. The elements 46 may be in contact with each other. For forming an array, the elements 46 are acoustically and electrically separated. This separation is provided by kerfs. The kerfs are the gaps at a desired width or average width.

In act 24, the gaps between the elements are expanded. The expansion separates the elements 46. Generally uniform gaps are created, such as the gaps having generally the same width between adjacent elements 46. Generally accounts for tolerances, such as due to material variation. Some gaps may be greater or less than others.

Any expansion may be used. For example, the tape 44 is expanded as represented in FIG. 2C. The tape 44 is flexible, so pulling on the edges cause the expansion. In one embodiment, thermal expansion is used. The temperature is controlled to provide the desired amount of expansion. The carrier 54 and/or tape 44 expand by a given amount for a given temperature. By controlling the temperature, the amount of expansion and corresponding gap widths are established. The size of the gaps is set based on the temperature.

Once the gaps are formed into the desired kerf size, the kerfs are to be filled in act 30. Filling the kerfs forms a composite of the elements 46 of transducer material and acoustically attenuating kerf filler as the transducer array. In one embodiment, the gaps are filled in act 30 while the gap width is held steady. Upon curing, the kerf filler holds the kerfs at a desired gap width.

In another embodiment represented in FIG. 1, spacers are inserted in act 26 to establish the desired gap width. The expansion of act 24 is performed to create gaps wider than desired. The spacers are inserted to set the kerf width.

The spacers are sheets, blocks, or particles. Any size or shape may be used. The spacers may be hollow with the hollow filled with air, gas, or other substance to provide desired acoustic damping, impedance, and/or other characteristic. In one embodiment, silicon dioxide particles of 12 microns or less in a largest dimension are used. For example, 1-10 micron particles are provided. Other materials may be used, such as melamine resin particles. Using vibration, fluid carrier, pouring, or other process, the spacers are inserted into the gaps. For example, the epoxy used as the kerf filler includes the spacers. By injecting the kerf filler, spacers are also positioned. FIG. 5A shows an example of spacers 58 inserted into the gaps between the elements 46.

The spacers establish the desired width of the kerfs. Once inserted, the gaps are reduced in act 28. By decreasing the temperature, the gaps are reduced. Since the spacers are in the gaps, the reduction results in the contraction of the elements 46 against the spacers. By cooling the carrier 54, the elements 46 shift to be closer together. Other reduction may be used, such as relaxing a force applied to stretching the tape 44.

The reduction in the gaps may rearrange the spacers 58. Where the spacers 58 are particles, the contraction force may cause the particles to align or stack evenly, as represented in FIG. 5B. Vibration may be applied to assist rearrangement. With rearrangement and/or contraction against a spacer 58, the spacer 58 sets the kerf width regardless of further temperature decreases. A 5 um or less gap (kerf) may be achieved. Using the spacers, the gap width for the different lines or between different elements may be more likely the same or have less variance. By providing narrow kerfs (e.g., 5 micrometers or less), greater sensitivity may be provided. Narrow kerf widths are desired for high frequency transducers.

In act 30, the gaps are filled with a kerf filler. After the reduction and/or while the gaps are held at a desired width, the kerf filler in added. Any kerf filler may be used, such as a polymer or epoxy. For example, silicone or an epoxy is added. The kerf filler is deposited on and in the gaps, such as shown by the filler 48 in FIG. 2D. Pressure, scraping, injection, or other technique may be used to apply the kerf filler. The kerf filler flows or is applied within the gap. Where spacers are present, the kerf filler is applied around or with the spacers. In other embodiments, the gaps are filled only for well-defined areas (e.g., bottom and surface side) so that gaps for air, gas, or other substance are provided in the gaps for desired transducer or acoustic characteristics.

Once applied, the kerf filler is cured. The curing may be performed chemically (e.g., epoxy), over time, and/or with increased temperature. Where thermal expansion is used to establish the gap width, time or chemical reaction is used to cure the kerf filler. For example, the epoxy is UV-light-curable epoxy, which is curable at room temperature.

Once cured, the composite of the kerf filler 48 and the elements 46 forms the transducer array. The kerfs are less than fifteen micrometers wide, such as being less than twelve, ten, seven, or five micrometers wide. The cured kerf filler 48 holds the elements 46 in place relative to each other. Some bending, expansion, contraction or flexing may be provided in the composite. The composite may be a 1-3, 2-2, or other composite.

The transducer array may be further processed. Any of the features or structural arrangements for a stack of components used with the transducer array may be performed. For example, any variety of methods to stack and/or bond the different layers associated with multi-layer transducers (e.g., multiple layers of transducer material) are performed. Acts 32-36 show three further acts.

In act 32, the carrier 54 and/or tape 44 are removed. After the filler cures, the filler holds the array together. The tape 44 is not longer needed. The tape or adhesive of the tape is pulled off, vibrated off, and/or chemically removed. Etching or other process may be used to remove the tape 44. Where the tape 44 holds both the carrier 54 and the composite, removing the tape 44 may also remove the carrier 54 and supporting carrier 56.

In act 34, the composite is lapped. The top, bottom, and/or sides are lapped. A blade may be used to cut off a layer or material. Alternatively, etching, sanding, or other process for removing excess filler and/or substrate material is used. The elements are lapped to allow for deposition of other materials, such as electrodes and/or matching layers.

In act 36, electrodes are formed on the top and bottom surfaces of the elements. The electrodes may be formed just on the elements. Alternatively, the electrodes are formed over the entire composite. In one embodiment, a ground plane electrode is formed over the composite on a top surface. Element specific electrodes are formed on the bottoms of the elements for electrical isolation between elements. FIG. 2E shows an example generally of electrodes 50 formed on the composite.

The electrodes are formed by placing a flexible circuit against the composite. The flexible circuit includes pads for separately connecting with the elements 46. For the ground plane, a different flexible circuit includes a planar electrode for connecting with multiple or all of the elements 46. The flexible circuits are stacked with and bonded to the elements 46. The filler may be used to bond, so the flexible circuits are stacked prior to curing of the filler. The electrode layers 50 are conductors on KAPTON™, deposited electrodes, or any other material. In other embodiments, the electrodes are patterned and etched or deposited on the composite using semiconductor processing.

Different layers may be stacked and bonded with the transducer array. One or more matching layers, optionally another transducer array layer, and a backing block are adjacently formed in a stack. Additional, different, or fewer components may be used. The layers may be stacked in a different order, such as providing the top electrode separated from the elements by a matching layer. The different layers of the array are bonded together via sintering, lamination, asperity contact, or any other chemical or mechanical structure or technique used to hold the layers together.

FIGS. 2A-E show the substrate, elements, and composite transducer array in cross section. FIG. 2F shows the transducer array 52 after filling from a top or bottom view. The array 52 includes a plurality of elements 46. The elements 46 are spaced apart by kerfs. The kerfs have an average width of less than fifteen microns, such as less than 10 or less than 5 microns. Since the elements 46 are formed by fracturing a piezoelectric ceramic rather than dicing with a saw, close positioning and correspondingly small kerfs may be provided. Greater kerf widths may be provided.

Where stealth dicing is used to form the elements 46, each element 46 includes the piezoelectric material and any remaining defect material. For example, the elements are formed from monocrystalline transducer material (e.g., PMN-PT). The defects for fracturing are polycrystalline. Once fractured, the edges of the elements 46 include some of the polycrystalline remaining from the defects. Other defect material may remain, such as where different starting material is used.

FIG. 2E shows the elements 46 distributed in a two-dimensional grid. The elements 46 are arranged in the azimuth and elevation directions. The depth direction is orthogonal to the plane of the figure. The array 52 is spaced along a square grid pattern. Alternatively, the multi-dimensional array 52 is spaced along a rectangular, hexagonal, triangular or other now known or later developed grid pattern. For square or rectangular grid patterns, the multi-dimensional array 52 includes M×N elements 46, such as where M extends along the azimuth dimension and N extends along the elevation dimension. Other arrays 52 may be used, such as one-dimensional arrays.

The number, size, and arrangement of the elements 46 may be based on the frequency and/or type of scanning to be performed. Tens, hundreds, or thousands of elements 46 may be provided. The transducer array 52 is configured for use in a fetal cardiac probe, intraoperative probe, intracavity probe, external probe, catheter, handheld probe, or any other known or future probe. The transducer array 52 is arranged for cardiology and/or radiology applications.

The transducer array 52 includes filler material 48 between the elements 46. The filler material 48 is within the kerfs. The kerfs are the gaps between the elements 46. The filler material

48 at least partially acoustically isolates the elements 46 and/or holds the elements 46 in relative position. The filler 48 and elements 46 form a composite, such as a 1-3 composite of single crystal.

The kerfs may include spacers. The spacers extend across the width, but may only extend across part of the width. The spacers are of an acoustically isolating material, such as an acoustic absorbing material. The spacers are sized to provide the desired kerf width, such as less than twelve microns.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

We claim:

1. A method for forming an ultrasound transducer array, the method comprising:
   forming, with a laser, defects along lines within a ceramic transducer substrate;
   fracturing the ceramic transducer substrate at the lines into elements of the ultrasound transducer array;
   thermally expanding gaps between the elements;
   inserting spacers into the gaps between the elements while expanded;
   thermally reducing the gaps with the spacers in the gaps; and
   filling the gaps with kerf filler after the reducing.

2. The method of claim 1 wherein forming comprises focusing the laser at an interior of the ceramic transducer substrate, a focus of the laser scanned along the lines in multiple layers.

3. The method of claim 1 wherein forming comprises laser dicing in a dry process.

4. The method of claim 1 wherein forming comprises stealth dicing.

5. The method of claim 1 wherein the ceramic transducer substrate comprises a monocrystalline material, and wherein forming comprises converting the monocrystalline material along the lines to polycrystalline, the converting being within an interior of the ceramic transducer substrate.

6. The method of claim 1 wherein forming comprises forming with a laser having a wave length of 300-2000 nanometers in the ceramic transducer substrate having a thickness of 100-500 micrometers and being lead magnesium niobate-lead titanate crystal.

7. The method of claim 1 wherein fracturing comprises performing the expanding with an increase in temperature, the increase in temperature causing expansion of a carrier of the ceramic transducer substrate.

8. The method of claim 1 wherein the lines extend along a width dimension and wherein fracturing comprises applying force along a thickness dimension.

9. The method of claim 1 wherein fracturing comprises fracturing with force applied other than by the thermally expanding and wherein expanding comprises expanding after fracturing, the size of the gaps being a function of a temperature for expanding.

10. The method of claim 1 wherein inserting comprises inserting particles of 12 microns or less within the gaps, and wherein thermally reducing the gaps comprises cooling, the reduction in the gaps rearranging the particles within the gaps.

11. The method of claim 1 wherein filling comprises filling with a polymer, the spacers being within the gaps during the filling.

12. The method of claim 1 further comprising:
   removing, after curing of the kerf filler, a carrier from the elements;
   lapping the elements; and
   forming electrodes on top and bottom surfaces of the elements.

13. The method of claim 1 wherein filling comprises curing the kerf filler with the gaps being less than 12 microns wide.

14. A method for forming an ultrasound transducer array, the method comprising:
   generating defects in a pattern within an interior of a substrate of lead magnesium niobate-lead titanate crystal wherein generating the defects comprises forming the defects by converting monocrystalline to polycrystalline material with a laser focused in the interior;
   breaking the substrate along the pattern into elements of the ultrasound transducer array; and
   curing polymer in gaps between the elements, the gaps being less than 15 microns in width.

15. A method for forming an ultrasound transducer array, the method comprising:
   generating defects in a pattern within an interior of a substrate of lead magnesium niobate-lead titanate crystal;
   breaking the substrate along the pattern into elements of the ultrasound transducer array;
   curing polymer in gaps between the elements, the gaps being less than 15 microns in width;
   increasing the gaps with thermal expansion; then filling the gaps with particles, the particles being twelve microns or less in a longest diameter; and then
   reducing the gaps.

* * * * *